United States Patent [19]

Takahashi

[11] Patent Number: 4,746,810
[45] Date of Patent: May 24, 1988

[54] PULSE GENERATING CIRCUIT

[75] Inventor: Yasushi Takahashi, Tokyo, Japan

[73] Assignee: NEC Corporation, Tokyo, Japan

[21] Appl. No.: 90,485

[22] Filed: Aug. 28, 1987

[30] Foreign Application Priority Data

Aug. 28, 1986 [JP] Japan ................. 61-203027

[51] Int. Cl.[4] .................. H03K 3/00; H03K 5/153; H03B 5/30
[52] U.S. Cl. ............................. 307/106; 307/350; 328/59; 331/116 FE
[58] Field of Search ............... 307/106, 350, 351, 362, 307/530, 269; 328/59, 63, 72, 115; 331/115, 116 R, 116 FE; 368/157, 159

[56] References Cited

U.S. PATENT DOCUMENTS

| | | | |
|---|---|---|---|
| 3,676,801 | 7/1972 | Musa | 331/116 FE |
| 3,947,697 | 3/1976 | Archer et al. | 328/63 |
| 4,039,973 | 8/1977 | Yamashiro | 368/159 |
| 4,346,350 | 8/1982 | Morokawa et al. | 368/159 |
| 4,651,113 | 3/1987 | Fujita | 331/109 |
| 4,704,587 | 11/1987 | Outang et al. | 331/116 FE |

Primary Examiner—Vit W. Miska
Attorney, Agent, or Firm—Sughrue, Mion, Zinn, Macpeak and Seas

[57] ABSTRACT

For producing a pulse train consisting of pulses each having a constant pulse height, there is provided a pulse generating circuit comprises an oscillation circuit having an amplification stage and operative to produce a raw pulse train consisting of pulses including pulses with insufficient pulse heights, and an elimination circuit having a pulse height monitoring circuit operative to produce a dummy voltage level, a flip-flop circuit operative to produce an activating signal under the application of the dummy voltage level higher than a threshold voltage thereof and a logic gate operative to produce the pulse train based on the raw pulse train in the presence of the activating signal, the pulse height monitoring circuit is provided with field-effect transistors identical in characteristics with corresponding component field-effect transistors forming part of the amplification stage, then the eliminating circuit can eliminate pulses with insufficient pulse heights even if the voltage source is decreased in voltage level with time.

13 Claims, 3 Drawing Sheets

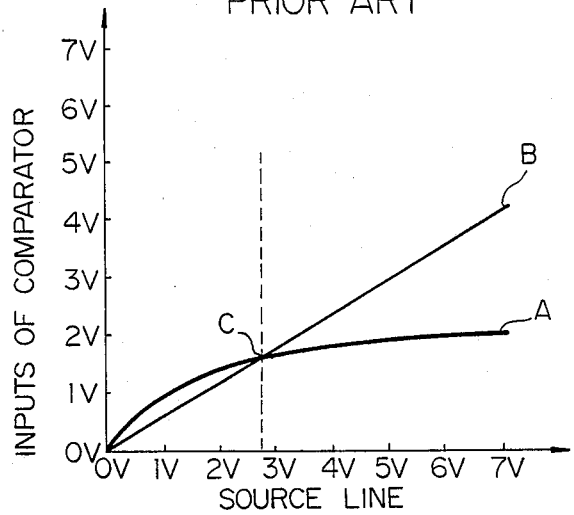
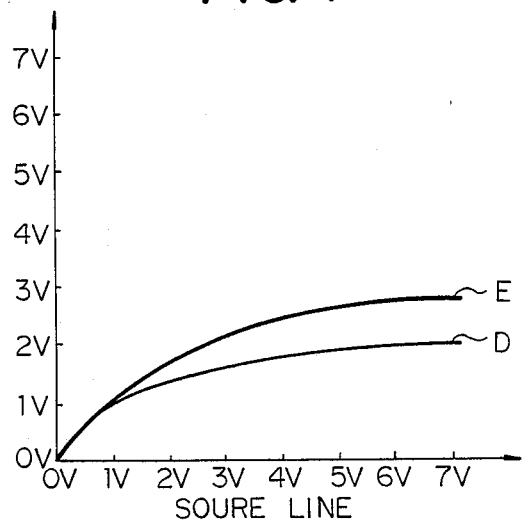

PULSE GENERATING CIRCUIT

FIELD OF THE INVENTION

This invention relates to a pulse generating circuit and, more particularly, to a pulse generating circuit operative to constantly produce a pulse train with a preselected pulse height.

BACKGROUND OF THE INVENTION

A typical example of a pulse generating circuit is illustrated in FIG. 1. The pulse generating circuit comprises an oscillation circuit 1, a voltage divider 2, a comparator 3, a flip-flop circuit 4 and an AND gate 5. The oscillation circuit 1 comprises a series combination of a p-channel MOS field-effect transistor 6, a resistor 7 and an n-channel MOS field-effect transistor 8 coupled between a source line 9 of a positive voltage level $V_{DD}$ and a ground line 10 of the ground voltage level $V_G$, a resistor 11 coupled between the drain node and the gate electrode of the MOS field-effect transistor 8 for providing an appropriate difference in voltage therebetween, a capacitor 12 coupled between the gate electrode of the MOS field-effect transistor 8 and the ground, a capacitor 13 coupled between the drain node of the MOS field-effect transistor 8 and the ground, and a crystal oscillator 14 coupled between the gate electrode and the drain node of the MOS field-effect transistor 8. The drain node of the MOS field-effect transistor 8 performs as an output node 15 of the oscillation circuit 1, and the output node 15 of the oscillation circuit 1 is coupled in parallel to one input node of the comparator 3 and an input node of the AND gate 5. The pulse generating circuit illustrated in FIG. 1 further has a control node 16 connected to the gate electrode of the MOS field-effect transistor 6 as well as a reset node of the flip-flop circuit 4 and an output node 17 to which a pulse train consisting of pulses each having a sufficient pulse height is supplied from an output node of the AND gate 5. The series combination of the MOS field-effect transistor 6, the resistor 7 and the MOS field-effect transistor 8 forms an amplification stage of the oscillation circuit 1.

The voltage divider 2 comprises a series of resistors 18 and 19 coupled between the source line 9 and the ground line 10 and is operative to produce a reference voltage level $V_{REF}$ which is constantly supplied to the other input node of the comparator 3. The voltage divider 2 thus arranged serves as a reference voltage producing circuit. The comparator 3 is operative to compare a voltage level at the one input node coupled to the output node 15 with the reference voltage level $V_{REF}$ at the other input node and produces an output signal when the voltage level at the one input node excesses the reference voltage level $V_{REF}$. The output signal of the comparator 3 is supplied from an output node of the comparator 3 to a set node of the flip-flop circuit 4 and causes the flip-flop circuit 4 to change from the reset state to the set state.

In operation, when a control signal appears at the control node 16, the MOS field-effect transistor 6 turns on, then the oscillation circuit 1 is activated to produce an oscillation signal or a raw pulse train. In the initial stage of the activation, the raw pulse train includes pulses each having a pulse height lower than the reference voltage level $V_{REF}$, so that the comparator 3 does not produce the output signal. This results in that the flip-flop circuit 4 remains in the reset state. When the flip-flop circuit 4 is in the reset state, the flip-flop circuit 4 does not produce an output signal Q, then the AND gate 5 can not produce any pulse train. However, if the oscillation circuit 1 produces a raw pulse train consisting of sufficiently developed pulses, each of the pulses has a pulse height which excesses the reference voltage level $V_{REF}$, then the comparator 3 produces the output signal which is supplied to the set node of the flip-flop circuit 4. With the output signal supplied from the comparator 3, the flip-flop circuit 4 is changed from the reset state to the set state, thereby producing the output signal Q which is supplied to the AND gate 5. The output signal Q allows the AND gate 5 to produce the pulse train which consists of the pulses each having the sufficient pulse height.

The voltage divider 2, comparator 3, the flip-flop circuit 4 and the AND gate thus forms in combination an eliminating circuit which prohibits the pulse generating circuit from production of a pulse train including a pulse with an insufficient pulse height.

However, a problem is encountered in the prior-art pulse generating circuit in producing a pulse train including a pulse with an insufficient pulse height when the voltage level on the source line 9 is decreased. In detail, the output node 15 is coupled to the source line 9 and the ground line 10 through the MOS field-effect transistors 6 and 8, respectively, so that the output node 15 is varied in voltage level by changing the voltage level on the source line 9 as indicated by plots A in FIG. 2 of the drawings. On the other hand, the reference voltage $V_{REF}$ is determined by proportional allotment based on the resistance values of the resistors 18 and 19. Then, the reference voltage $V_{REF}$ is varied by changing the voltage level on the source line 9 as indicated by plots B in FIG. 2. Comparing plots A with plots B, plot A intersects plots B at point C. If the reference voltage $V_{REF}$ is selected on the assumption that the source line 9 is higher in voltage level than point C at all times, the comparator 3 produces the output signal under the reduction of voltage level on the source line 9 below point C even if a raw pulse train consists of pulses each having an insufficient pulse height. For example, when the source line 9 is supplied from a battery, the above problem would take place with time.

It is therefore an important object of the present invention to provide a pulse generating circuit operative to produce a pulse train with a sufficient pulse height.

It is another important object of the present invention to provide a pulse generating circuit which is free from the fluctuation of voltage level on a source of voltage.

SUMMARY OF THE INVENTION

To accomplish these objects, the present invention proposes to provide a pulse height monitoring circuit operative to produce a dummy voltage level for comparing with the raw pulse train and similar in circuit arrangement to the amplification stage of the oscillation circuit.

In accordance with one aspect of the present invention, there is provided a pulse generating circuit comprising for producing a pulse train consisting of a number of pulses each having a preselected pulse height, comprising (a) a control node applied with a control signal, (b) an oscillation circuit operative to produce a raw pulse train consisting of a number of pulses including at least one pulse having a pulse height shorter than the preselected pulse height when the control signal appears at the control node and comprising (i) an amplification stage having a series combination of a first field-effect transistor, a first resistor and a second field-effect transistor coupled between a first source of voltage and a second source of voltage different in voltage level from the first source of voltage, the first field-effect transistor having a gate electrode coupled to the control node, (ii) a second resistor coupled between a drain node and a gate electrode of the second field-effect transistor, (iii) a crystal oscillator coupled between the drain node and the gate electrode of the second field-effect transistor, (ix) a first capacitor coupled between the gate electrode of the second field effect transistor and the second source of voltage, and (x) a second capacitor coupled between the drain node of the second field effect transistor and the second source of voltage, and (c) an elimination circuit operative to eliminate the pulse with the pulse height shorter than the preselected pulse height from the raw pulse train and comprising (i) a pulse height monitoring circuit having a series combination of a third field-effect transistor, a third resistor and a fourth field-effect transistor coupled between the first source of voltage and the second source of voltage, the third and fourth field effect transistors having respective characteristics substantially identical with those of the first and second field-effect transistors, respectively, the third field-effect transistor having a gate electrode coupled to the control node and causing a dummy voltage level to appear at a drain node of the fourth field-effect transistor when the control signal appears at the control node, the fourth field-effect transistor having a gate electrode coupled to the drain node of the second field-effect transistor, (ii) a flip-flop circuit having two input nodes one of which is coupled to the drain node of the fourth field-effect transistor and the other of which is coupled to the control node and operative to produce an activating signal when the dummy voltage level excesses a preselected value, and (iii) a logic gate operative to produce the pulse train on the basis of the raw pulse train when the activating signal is supplied from the flip-flop circuit.

In accordance with another aspect of the present invention, there is provided a pulse generating circuit producing a pulse train consisting of a number of pulses each having a preselected pulse height comprising (a) a control node applied with a control signal, (b) a resonant circuit operative to produce an oscillation signal, (c) a first inverter circuit operative to produce a raw pulse train at an output node thereof based on the oscillation signal in the presence of the control signal, the raw pulse train consisting of a number of pulses including at least one pulse having a pulse height shorter than the preselected pulse height, (d) a second inverter circuit coupled in series to the first inverter circuit and operative to produce a dummy voltage level at an output node thereof in the presence of the control signal, and (e) a logic circuit having a threshold voltage thereof and activated to produce the pulse train based on the raw pulse train when the dummy voltage level excesses the threshold voltage thereof, wherein the first inverter circuit is identical in circuit arrangement with the second inverter circuit.

BRIEF DESCRIPTION OF THE DRAWINGS

The features and advantages of a pulse generating circuit according to the present invention will be more clearly understood from the following description taken in conjunction with the accompanying drawings in which:

FIG. 2 is a graph showing variations of respective input levels of the comparator of the prior-art pulse generating circuit in terms of the voltage levels on the source line;

FIG. 4 is a graph showing variations of voltage levels at corresponding nodes of the preferred embodiment in terms of the voltage levels on the source line.

DESCRIPTION OF THE PREFERRED EMBODIMENT

Figure 1:
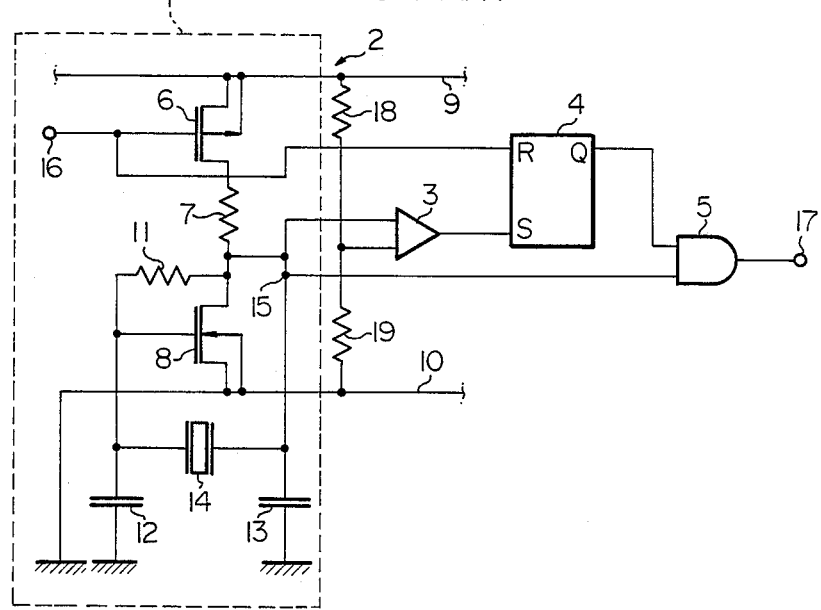
FIG. 1 is a diagram showing the circuit arrangement of a typical example of a prior-art pulse generating circuit.
Figure 3:
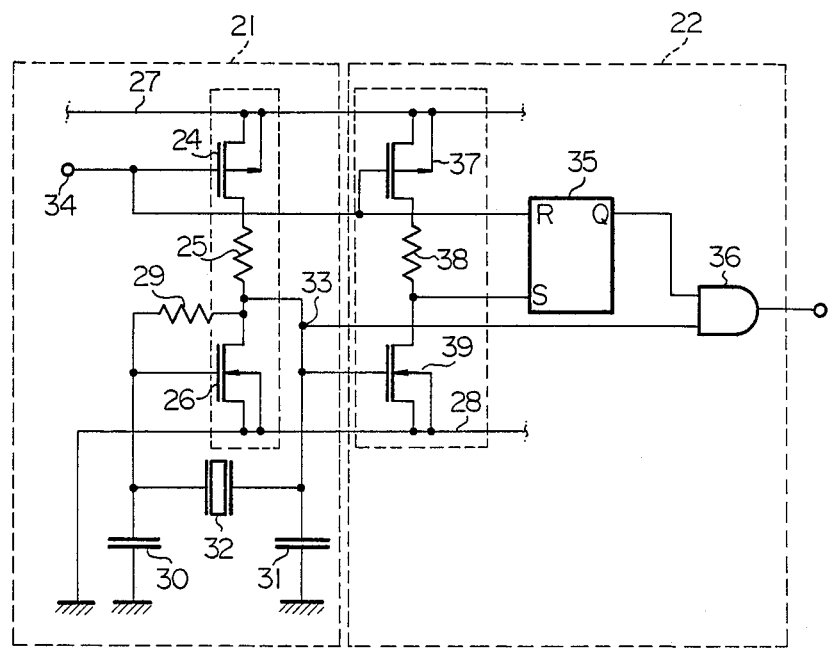
FIG. 3 is a diagram showing the circuit arrangement of a preferred embodiment according to the present invention.

Referring to FIG. 3 of the drawings, there is shown a circuit arrangement of a pulse generating circuit according to the present invention. The pulse generating circuit illustrated in FIG. 3 comprises an oscillation circuit 21 and an elimination circuit 22. The oscillation circuit 21 comprises a series combination of a p-channel MOS field-effect transistor 24, a resistor 25 and an n-channel MOS field-effect transistor 26 coupled between a source line 27 of a positive voltage level $V_{DD}$ and a ground line 28 of the ground level $V_G$, a resistor 29 coupled between a drain node and a gate electrode of the MOS field-effect transistor 26 for providing an appropriate difference in voltage level therebetween, a capacitor 30 coupled between the gate electrode of the MOS field-effect transistor 26 and the ground, a capacitor 31 coupled between the drain node of the MOS field-effect transistor 26 and the ground, and a crystal oscillator 32 coupled between the drain node and the gate electrode of the MOS field-effect transistor 26. The series combination of the MOS field-effect transistor 24, the resistor 25 and the MOS field-effect transistor 26 forms an inverter circuit for an amplification stage of the oscillation circuit 21 and the drain node of the MOS field-effect transistor 26 performs as an output node 33 of the oscillation circuit 21. The amplification stage is operative to provide an appropriate basing voltage $V_B$ to the output node 33. The crystal oscillator 32, and the capacitors 30 and 31 form a resonant circuit.

The pulse generating circuit illustrated in FIG. 3 further has a control node 34 connected to a gate electrode of the MOS field-effect transistor 24 so that the amplification stage formed by the series combination of the MOS field-effect transistor 24, the resistor 25 and the MOS field-effect transistor 26 is activated in the presence of the control signal of a low voltage level applied to the control node 34 and produces a raw pulse train which appears at the output node 33 of the oscillation circuit 21. In the initial stage of the activation, the raw pulse train consists of pulses each having a pulse height smaller in value than a preselected voltage level. In this instance, the preselected voltage level relates to a threshold voltage level of a flip-flop circuit 35 which is described hereinafter. However, after a certain period of time, the oscillation circuit 21 produces a raw pulse train consisting of pulses each having a pulse height larger in value than the preselected voltage level.

The elimination circuit 22 comprises the flip-flop circuit 35, an AND gate 36 and a pulse height monitoring circuit having an inverter circuit or a series combination of a p-channel MOS field-effect transistor 37, a resistor 38 and an n-channel MOS field-effect transistor 39. The MOS field-effect transistor 39 has a gate electrode coupled to the output node 33 of the oscillation circuit 21, then the MOS field-effect transistor 39 is complementarily shifted between on and off states with respect to the MOS field-effect transistor 26. The p-channel MOS field effect transistor 37 has a gate electrode coupled to the control node 34, then the MOS field-effect transistor 37 is turned off in the absence of the control signal, but the MOS field-effect transistor 37 turns on to supply a current from the source line 27 to a drain node of the MOS field-effect transistor 39 through the resistor 38 when the control signal of the low voltage level appears at the control node 34. With the current supplied from the source line 27, a dummy voltage level $V_{DM}$ appears at the drain node of the MOS field-effect transistor 39. In this instance, the MOS field effect transistors 37 and 39 have respective characteristics, such as, for example, current driving capabilities, substantially identical with those of the MOS field-effect transistors 24 and 26, respectively. As the MOS field-effect transistors 24 and 37 are identical in characteristics with each other, the dummy voltage level $V_{DM}$ reflects a pulse height of a pulse forming part of a raw pulse train appearing at the output node 33.

The relationship between the basing voltage $V_B$ and the dummy voltage level $V_{DM}$ may be selected as follows. When the control signal of the low voltage level appears at the control node 34, each pulse of the raw pulse train appearing at the output node 33 swings its voltage level with respect to the basing voltage level $V_B$. Assuming now that the pulse amplitude of each pulse included in the raw pulse train is represented by $V_P$, the flip-flop circuit 35 is shifted into the set state when the pulse amplitude is developed to be larger in value than a difference voltage level $V_{DF}$ between the basing voltage $V_B$ and the dummy voltage level $V_{DM}$. The larger difference in voltage level between the pulse amplitude $V_P$ and the difference voltage level $V_{DF}$ the pulse generating circuit has, the more stable pulse train the circuit produces. Then, it is preferable to select the basing voltage level $V_B$ and the dummy voltage level $V_{DM}$ different from each other or as follows.

$$V_B \neq V_{DM}, \text{ or } |V_{DF}| > 0$$

In order to establish the relationship between the basing voltage level $V_B$ and the dummy voltage level $V_{DM}$ as above described, typically $|V_{DF}| > V_{DD}/5$, it is necessary to make a slight difference between one component of the series combination of the field-effect transistors 24 and 26 and the resistor 25 and one component of the series combination of the field-effect transistors 37 and 39 and the resistor 38.

The drain node of the MOS field-effect transistor 39 is coupled to a set node of the flip-flop circuit 35 and a reset node of the flip-flop circuit 35 is capable of being supplied with the control signal from the control node 34. Then, the flip-flop circuit 35 remains in a reset state in the absence of the control signal of the low voltage level, but the flip-flop circuit 35 is shifted from the reset state to a set state when the dummy voltage level $V_{DM}$ excesses the threshold voltage level of the flip-flop circuit 35 in the presence of the control signal of the low voltage level. The flip-flop circuit 35 further has an output node which is coupled to one input node of the AND gate 36 and the other input node of the AND gate 36 is coupled to the output node 33 of the oscillation circuit 21. When the dummy voltage level $V_{DM}$ excesses the threshold voltage level, the flip-flop circuit 35 is shifted to the set state to produce an activation signal Q of the positive high level at the output node thereof. Then, the the AND gate 36 is activated to produce the pulse train consisting of the pulses each having the pulse height larger in value than the preselected voltage level.

The operation of the pulse generating circuit illustrated in FIG. 3 will be summarized hereinunder. When the control node 34 remains in the high voltage level, which is in the absence of the control signal, the MOS field effect transistors 24 and 37 are turned off and the flip-flop circuit 35 remains in the reset state, then the amplification stage and the elimination circuit stand idle so that pulse generating circuit does not produce the pulse train even if a raw pulse train with an extremely small amplitude appears at the output node 33. On the other hand, when the control signal of the low voltage level appears at the control node 34, the MOS field effect transistors 24 and 37 turn on to supply currents to the MOS field-effect transistors 26 and 39 through the resistors 25 and 38, respectively, and the flip-flop circuit 35 is shifted from the reset state to the set state, then the amplification stage of the oscillation circuit 1 and the pulse height monitoring circuit 22 are activated. In the initial stage of the activation, the oscillation circuit 21 produces the raw pulse train consisting of the pulses each having the pulse height smaller in value than the preselected voltage level, however the dummy voltage level $V_{DM}$ also remains below the threshold voltage level of the flip-flop circuit 35. With the dummy voltage level $V_{DM}$ below the threshold voltage level of the flip-flop circuit 35, the flip-flop circuit 35 remains in the reset state so that the AND gate 36 does not produce the pulse train because of the absence of the activating signal. When the amplification stage of the oscillation circuit 21 develops the pulse height into a sufficiently high level or the preselected voltage level, the dummy voltage level $V_{DM}$ also excesses the threshold voltage level of the flip-flop circuit 35, then the flip-flop circuit 35 is shifted to the set state and produces the activating signal which is supplied to the AND gate 36. With the activating signal supplied from the flip-flop circuit 35, the AND gate produces the pulse train consisting of the pulses each having the pulse height lager in value than the preselected voltage level.

The basing voltage $V_B$ and the dummy voltage level $V_{DM}$ are given by Equations 1 and 2, respectively, $$V_B = V_{TN26} + \{\sqrt{\alpha 26^2 + 2\beta_{N26}\alpha 26(V_{DD} - V_{TN26})} - \alpha 26\}/\beta_{N26} \quad \text{(Eq. 1)}$$

where $V_{TN26}$ is the threshold voltage level of the MOS field-effect transistor 26 and $\beta_{N26}$ and $\alpha 26$ are calculated by Equations 3 and 4.

$$V_{DM} = V_{TN39} + \{\sqrt{\alpha 39^2 + 2\beta_{N39}\alpha 39(V_{DD} - V_{TN39})} - \alpha 39\}/\beta_{N39} \quad \text{(Eq. 2)}$$

where $V_{TN39}$ is the threshold voltage level of the MOS field-effect transistor 39 and $\beta_{N39}$ and $\alpha 39$ are calculated by Equations 5 and 6.

$$\beta_{N26} = (\mu 0 \epsilon 0 \epsilon s/t_{ox}) \times W/L \qquad \text{(Eq. 3)}$$

where $\mu 0$ is the electron mobility in the channel formed in the MOS field-effect transistor 26, $\epsilon 0$ is the Permittivity in vacuum, $\epsilon s$ is the semiconductor permittivity of a semiconductor material providing the MOS field-effect transistor 26, $t_{ox}$ is the thickness of the gate oxide of the MOS field-effect transistor 26, W is the width of the channel formed in the MOS field-effect transistor 26, and the L is the length of the channel.

$$\alpha 26 = \beta_{P24}(V_{DD} - V_{TP24})/\{1 + R\beta_{P24}(V_{DD} - V_{TP24})\} \qquad \text{(Eq. 4)}$$

where $V_{TP24}$ is the threshold voltage level of the MOS field-effect transistor 24, and $\beta_{P24}$ is given by Equation 7.

$$\beta_{N39} = (\mu 0 \epsilon 0 \epsilon s/t_{ox}) \times W/L \qquad \text{(Eq. 5)}$$

where $\mu 0$ is the electron mobility in the channel formed in the MOS field-effect transistor 39, $\epsilon 0$ is the Permittivity in vacuum, $\epsilon s$ is the semiconductor permittivity of a semiconductor material providing the MOS field-effect transistor 39, $t_{ox}$ is the thickness of the gate oxide of the MOS field-effect transistor 39, W is the width of the channel formed in the MOS field-effect transistor 39, and the L is the length of the channel.

$$\alpha 39 = \beta_{P37}(V_{DD} - V_{TP37})/\{1 + R\beta_{P37}(V_{DD} - V_{TP37})\} \qquad \text{(Eq. 6)}$$

where $V_{TP37}$ is the threshold voltage level of the MOS field-effect transistor 37, and $\beta_{P37}$ is given by Equation 8.

$$\beta_{P24} = (\mu 0 \epsilon 0 \epsilon s/t_{ox}) \times W/L \qquad \text{(Eq. 7)}$$

where $\mu 0$ is the electron mobility in the channel formed in the MOS field-effect transistor 24, $\epsilon 0$ is the Permittivity in vacuum, $\epsilon s$ is the semiconductor permittivity of a semiconductor material providing the MOS field-effect transistor 24, $t_{ox}$ is the thickness of the gate oxide of the MOS field-effect transistor 24, W is the width of the channel formed in the MOS field-effect transistor 24, and the L is the length of the channel.

$$\beta_{P37} = (\mu 0 \epsilon 0 \epsilon s/t_{ox}) \times W/L \qquad \text{(Eq. 8)}$$

where $\mu 0$ is the electron mobility of the channel formed in the MOS field-effect transistor 37, $\epsilon 0$ is the Permittivity in vacuum, $\epsilon s$ is the semiconductor permittivity of a semiconductor material providing the MOS field-effect transistor 37, $t_{ox}$ is the thickness of the gate oxide of the MOS field-effect transistor 37, W is the width of the channel formed in the MOS field-effect transistor 37, and the L is the length of the channel.

When the source line 27 is decreased in voltage level, the basing voltage is decreased as indicated by plots D of FIG. 4. Similarly, the dummy voltage level $V_{DM}$ is varied by changing the voltage level on the source line 27 as indicated by plots E. Comparing plots D with plots E it is understood that plots D has a tendency similar to that of the plots E. In other words, even if the source line 27 is decreased in voltage level, the dummy voltage level $V_{DM}$ is equal to or higher than the basing voltage $V_B$ at all times. This results in that the oscillation circuit does not produce the pulse train under the dummy voltage level lower than the threshold voltage level of the flip-flop circuit 35.

Although particular embodiment of the present invention have been shown and described, it will be obvious to those skilled in the art that various changes and modifications may be made without departing from the spirit and scope of the present invention.

What is claimed is:

1. A pulse generating circuit for producing a pulse train consisting of a number of pulses each having a preselected pulse height, comprising:
   (a) a control node applied with a control signal;
   (b) an oscillation circuit operative to produce a raw pulse train consisting of a number of pulses including at least one pulse having a pulse height shorter than said preselected pulse height when said control signal appears at said control node and comprising
      (i) an amplification stage having a series combination of a first field-effect transistor, a first resistor and a second field-effect transistor coupled between a first source of voltage and a second source of voltage different in voltage level from the first source of voltage, said first field-effect transistor having a gate electrode coupled to said control node,
      (ii) a second resistor coupled between a drain node and a gate electrode of said second field-effect transistor,
      (iii) a crystal oscillator coupled between the drain node and the gate electrode of said second field-effect transistor,
      (ix) a first capacitor coupled between the gate electrode of said second field effect transistor and said second source of voltage, and
      (x) a second capacitor coupled between the drain node of said second field effect transistor and said second source of voltage, and;
   (c) an elimination circuit operative to eliminate said pulse with the pulse height shorter than said preselected pulse height from said raw pulse train and comprising
      (i) a pulse height monitoring circuit having a series combination of a third field-effect transistor, a third resistor and a fourth field-effect transistor coupled between said first source of voltage and said second source of voltage, said third and fourth field effect transistors having respective characteristics substantially identical with those of said first and second field-effect transistors, respectively, said third field-effect transistor having a gate electrode coupled to said control node and causing a dummy voltage level to appear at a drain node of said fourth field-effect transistor when said control signal appears at the control node, said fourth field-effect transistor having a gate electrode coupled to the drain node of said second field-effect transistor,
      (ii) a flip-flop circuit having two input nodes one of which is coupled to the drain node of the fourth field-effect transistor and the other of which is coupled to said control node and operative to produce an activating signal when said dummy voltage level excesses a preselected value, and
      (iii) a logic gate operative to produce said pulse train on the basis of said raw pulse train when said activating signal is supplied from said flip-flop circuit.

2. A pulse generating circuit as set forth in claim 1, in which said first and third field-effect transistors are of a p-channel type and said second and fourth field-effect transistors are of an n-channel type.

3. A pulse generating circuit as set forth in claim 2, in which said first source of voltage is operative to provide a positive voltage level to said first and third field-effect transistors.

4. A pulse generating circuit as set forth in claim 2, in which said second source of voltage is operative to provide a ground voltage level to said second and fourth field-effect transistors.

5. A pulse generating circuit as set forth in claim 1, in which said logic gate performs an AND operation.

6. A pulse generating circuit as set forth in claim 1, in which said first resistor and said third resistor are different in resistance value from each other.

7. A pulse generating circuit producing a pulse train consisting of a number of pulses each having a preselected pulse height, comprising:
(a) a control node applied with a control signal;
(b) an oscillation circuit operative to produce a raw pulse train consisting of a number of pulses including at least one pulse having a pulse height shorter than said preselected pulse height when said control signal appears at said control node and comprising
   (i) an amplification stage having a series combination of a first field-effect transistor of a p-channel type, a first resistor and a second field-effect transistor of an n-channel type coupled between a first source of a positive voltage level and a second source of a ground voltage level, said first field-effect transistor having a gate electrode coupled to said control node,
   (ii) a second resistor coupled between a drain node and a gate electrode of said second field-effect transistor,
   (iii) a crystal oscillator coupled between the drain node and the gate electrode of said second field-effect transistor,
   (ix) a first capacitor coupled between the gate electrode of said second field effect transistor and said second source of the ground voltage level, and
   (x) a second capacitor coupled between the drain node of said second field effect transistor and said second source of the ground voltage level, and;
(c) an elimination circuit operative to eliminate said pulse with the pulse height shorter than said preselected pulse height from said raw pulse train and comprising
   (i) a pulse height monitoring circuit having a series combination of a third field-effect transistor of the p-channel type, a third resistor and a fourth field-effect transistor of the n-channel type coupled between said first source of the positive voltage level and said second source of the ground voltage level, said third and fourth field effect transistors having respective characteristics substantially identical with those of said first and second field-effect transistors, respectively, said third field-effect transistor having a gate electrode coupled to said control node and causing a positive dummy voltage level to appear at a drain node of said fourth field-effect transistor when said control signal appears at the control node, said fourth field-effect transistor having a gate electrode coupled to the drain node of said second field-effect transistor,
   (ii) a flip-flop circuit having two input nodes one of which is coupled to the drain node of the fourth field-effect transistor and the other of which is coupled to said control node and operative to produce an activating signal when said dummy voltage level excesses a preselected value, and
   (iii) an AND gate operative to produce said pulse train on the basis of said raw pulse train when said activating signal is supplied from said flip-flop circuit.

8. A pulse generating circuit producing a pulse train consisting of a number of pulses each having a preselected pulse height, comprising:
(a) a control node applied with a control signal;
(b) a resonant circuit operative to produce an oscillation signal;
(c) a first inverter circuit operative to produce a raw pulse train at an output node thereof based on said oscillation signal in the presence of said control signal, said raw pulse train consisting of a number of pulses including at least one pulse having a pulse height shorter than the preselected pulse height;
(d) a second inverter circuit coupled in series to said first inverter circuit and operative to produce a dummy voltage level at an output node thereof in the presence of said control signal; and
(e) a logic circuit having a threshold voltage thereof and activated to produce said pulse train based on said raw pulse train when the dummy voltage level excesses the threshold voltage thereof, wherein said first inverter circuit is identical in circuit arrangement with said second inverter circuit.

9. A pulse generating circuit as set forth in claim 8, in which said resonant circuit comprises a crystal oscillator having first and second electrodes, a first capacitor coupled between the first electrode of the crystal oscillator and a source of a ground voltage level, and a second capacitor coupled between the second electrode of the crystal oscillator and the source of the ground voltage level.

10. A pulse generating circuit as set forth in claim 8, in which said first inverter circuit comprises a series combination of a first field-effect transistor of a p-channel type, a first resistor and a second field-effect transistor of an n-channel type coupled between a first source of a positive voltage level and a second source of a ground voltage level, said first field-effect transistor having a gate electrode coupled to said control node, said second field-effect transistor having a gate electrode coupled to a drain node thereof through a second resistor.

11. A pulse generating circuit as set forth in claim 8, in which said second inverter circuit comprises a series combination of a third field-effect transistor of a p-channel type, a third resistor and a fourth field-effect transistor of an n-channel type coupled between a first source of a positive voltage level and a second source of a ground voltage level, said third field-effect transistor having a gate electrode coupled to said control node, said fourth field-effect transistor having a gate electrode coupled to the output node of said first inverter circuit.

12. A pulse generating circuit as set forth in claim 8, said logic circuit comprises a flip-flop circuit having a reset node coupled to said control node and a set node coupled to the output node of said second inverter circuit and operative to produce an activating signal when the dummy voltage level excesses a threshold voltage thereof, and an AND gate operative to produce said pulse train based on said raw pulse train in the presence of the activating signal.

13. A pulse generating circuit as set forth in claim 10, in which said second inverter circuit comprises a series combination of a third field-effect transistor of a p-channel type, a third resistor and a fourth field-effect transistor of an n-channel type coupled between a first source of a positive voltage level and a second source of a ground voltage level, said third field-effect transistor having a gate electrode coupled to said control node, said fourth field-effect transistor having a gate electrode coupled to the output node of said first inverter circuit, and in which one of said first and second field-effect transistors and the first resistor is different in characteristic from corresponding component of said series combination of said third field-effect transistor, said third resistor and said fourth field-effect transistor.

* * * * *

UNITED STATES PATENT AND TRADEMARK OFFICE
CERTIFICATE OF CORRECTION

PATENT NO. : 4,746,810

DATED : May 24, 1988

INVENTOR(S) : Takahashi

It is certified that error appears in the above-identified patent and that said Letters Patent is hereby corrected as shown below:

| | |
|---|---|
| COLUMN 3, LINE 13 | Delete "(ix)" and insert --(iv)--; |
| COLUMN 3, LINE 15 | Delete "(x)" and insert (v)--; |
| COLUMN 6, LINE 4 | Delete first instance of "the"; |
| COLUMN 7, LINE 63 | After "plots" delete ","; insert -- , -- after "E"; |
| COLUMN 8, LINE 33 | Delete "(ix)" and insert --(iv)--; |
| COLUMN 8, LINE 36 | Delete "(x)" and insert --(v)--; |
| COLUMN 9, LINE 42 | Delete "(ix)" and insert --(iv)--; |
| COLUMN 9, LINE 46 | Delete "(x)" and insert --(v)--. |

Signed and Sealed this

Twenty-eighth Day of March, 1989

Attest:

DONALD J. QUIGG

Attesting Officer

Commissioner of Patents and Trademarks